(12) United States Patent
Kim et al.

(10) Patent No.: US 11,950,482 B2
(45) Date of Patent: Apr. 2, 2024

(54) COLOR CONVERSION PANEL AND DISPLAY DEVICE INCLUDING THE SAME

(71) Applicant: Samsung Display Co., LTD., Yongin-si (KR)

(72) Inventors: Hyo Joon Kim, Suwon-si (KR); Jung Hyun Kwon, Yongin-si (KR); Yun Ha Ryu, Hwaseong-si (KR); Ki Soo Park, Hwaseong-si (KR); Seon-Tae Yoon, Hwaseong-si (KR); Hye Seung Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/399,619

(22) Filed: Aug. 11, 2021

(65) Prior Publication Data

US 2022/0077239 A1   Mar. 10, 2022

(30) Foreign Application Priority Data

Sep. 10, 2020   (KR) .................. 10-2020-0116225

(51) Int. Cl.
  *H10K 59/38* (2023.01)
  *G02F 1/1335* (2006.01)
  *H10K 50/86* (2023.01)

(52) U.S. Cl.
  CPC ....... *H10K 59/38* (2023.02); *G02F 1/133512* (2013.01); *G02F 1/133514* (2013.01); *H10K 50/865* (2023.02)

(58) Field of Classification Search
  None
  See application file for complete search history.

(56) References Cited

U.S. PATENT DOCUMENTS

| 2005/0275343 | A1* | 12/2005 | Tanaka ................ H01L 27/322 313/506 |
| 2011/0249339 | A1* | 10/2011 | Horie ................ G02F 1/133512 359/601 |
| 2015/0042933 | A1* | 2/2015 | Ueki ................... G02B 5/0242 359/599 |
| 2015/0331278 | A1* | 11/2015 | Araki ................ G02F 1/133514 349/96 |
| 2016/0041430 | A1  | 2/2016 | Lee et al. |
| 2017/0076678 | A1* | 3/2017 | Lee ........................ G02F 1/1336 |

(Continued)

FOREIGN PATENT DOCUMENTS

| EP | 3 339 920 | 6/2018 |
| EP | 3 623 862 | 3/2020 |

(Continued)

*Primary Examiner* — Shan Liu
(74) *Attorney, Agent, or Firm* — KILE PARK REED & HOUTTEMAN PLLC

(57) ABSTRACT

A color conversion panel includes a first color filter and a second color filter that are disposed on a substrate, a low refractive index layer disposed on the substrate, the first color filter, and the second color filter, the low refractive index layer including at least one of a first blue pigment and a first blue dye, a first color conversion layer overlapping the first color filter and including a semiconductor nanocrystal, a second color conversion layer overlapping the second color filter and including a semiconductor nanocrystal, and a transmissive layer that overlaps the low refractive index layer.

18 Claims, 19 Drawing Sheets

(56) References Cited

U.S. PATENT DOCUMENTS

| | | |
|---|---|---|
| 2018/0156951 A1 | 6/2018 | Baek et al. |
| 2018/0292713 A1* | 10/2018 | Drolet .............. G02F 1/133621 |
| 2019/0296088 A1 | 9/2019 | Kim et al. |
| 2020/0081292 A1 | 3/2020 | Park et al. |
| 2020/0363575 A1 | 11/2020 | Baek et al. |
| 2021/0328168 A1 | 10/2021 | Park et al. |

FOREIGN PATENT DOCUMENTS

| | | |
|---|---|---|
| KR | 10-2017-0031613 | 3/2017 |
| KR | 10-2019-0110660 | 10/2019 |
| KR | 10-2019-0115131 | 10/2019 |
| KR | 10-2021-0129786 | 10/2021 |

* cited by examiner

COLOR CONVERSION PANEL AND DISPLAY DEVICE INCLUDING THE SAME

CROSS-REFERENCE TO RELATED APPLICATION(S)

This application claims priority to and benefits of Korean Patent Application No. 10-2020-0116225 under 35 U.S.C. § 119, filed in the Korean Intellectual Property Office on Sep. 10, 2020, the entire contents of which are incorporated herein by reference.

BACKGROUND

1. Technical Field

The disclosure relates to a display device including a color conversion panel.

2. Description of the Related Art

A display device including a color conversion panel using semiconductor nanocrystals such as quantum dots has been proposed in order to reduce light loss generated by a color filter, etc., and to implement a display device having a high color gamut.

The above information disclosed in this Background section is only for enhancement of understanding of the background of the disclosure, and therefore it may contain information that does not form the prior art that is already known in this country to a person of ordinary skill in the art.

SUMMARY

Embodiments have been made in an effort to provide a color conversion panel and a display device including the same, capable of improving display quality while simplifying a manufacturing process.

An embodiment of the disclosure provides a color conversion panel that may include a first color filter and a second color filter that are disposed on a substrate, a low refractive index layer disposed on the substrate, the first color filter, and the second color filter, the low refractive index layer including at least one of a first blue pigment and a first blue dye, a first color conversion layer overlapping the first color filter and including a semiconductor nanocrystal, a second color conversion layer overlapping the second color filter and including a semiconductor nanocrystal, and a transmissive layer that overlaps the low refractive index layer.

The color conversion panel may include a red light emission area, a green light emission area, a blue light emission area, and a light blocking area.

A first thickness of the low refractive index layer overlapping the blue light emission area may be different from a second thickness of the low refractive index layer overlapping the red light emission area.

The first thickness may be in a range of about 1 μm to about 6 μm, and the second thickness may be in a range of about 0.5 μm to about 3 μm.

A content of the first blue pigment or first blue dye included in the low refractive index layer may be in a range of about 1 wt % to about 2 wt %.

The transmissive layer may contain a second blue pigment or a second blue dye.

A content of the second blue pigment or the second blue dye included in the transmissive layer may be greater than a content of the first blue pigment or the first blue dye included in the low refractive index layer.

A refractive index of the low refractive index layer may be in a range of about 1.1 to about 1.3.

The first color filter may include a first-first color filter that overlaps the red light emission area, and a first-second color filter that overlaps the light blocking area.

The second color filter may include a second-first color filter that overlaps the green light emission area, and a second-second color filter that overlaps the light blocking area.

The first-second color filter, the second-second color filter, and the low refractive index layer may overlap in the light blocking area.

An embodiment of the disclosure provides a display device that may include a display panel, and a color conversion panel that overlaps the display panel, wherein the color conversion panel may include a substrate that overlaps the display panel, a first color filter and a second color filter that are disposed between the substrate and the display panel, a low refractive index layer disposed on the substrate, the first color filter, and the second color filter, the low refractive index layer including at least one of the first blue pigment and the first blue dye, a first color conversion layer overlapping the first color filter and including a semiconductor nanocrystal, a second color conversion layer overlapping the second color filter and including a semiconductor nanocrystal, and a transmissive layer that overlaps the low refractive index layer.

The color conversion panel may include a red light emission area, a green light emission area, a blue light emission area, and a light blocking area.

A first thickness of the low refractive index layer overlapping the blue light emission area may be different from a second thickness of the low refractive index layer overlapping the red light emission area.

The first thickness may be in a range of about 1 μm to about 6 μm, and the second thickness may be in a range of about 0.5 μm to about 3 μm.

A content of the first blue pigment or the first blue dye included in the low refractive index layer may be in a range of about 1 wt % to about 2 wt %.

The transmissive layer may include the second blue pigment or the second blue dye.

A content of the second blue pigment or the second blue dye included in the transmissive layer may be greater than a content of the first blue pigment or the first blue dye included in the low refractive index layer.

The first blue pigment may be different from the second blue pigment, and the first blue dye may be different from the second blue dye.

A refractive index of the low refractive index layer may be in a range of about 1.1 to about 1.3.

According to embodiments, a manufacturing process may be simple, and reflectance of external light may be reduced, thereby providing a color conversion panel having excellent color display quality. A display device including a color conversion panel may be provided.

DETAILED DESCRIPTION OF THE EMBODIMENTS

Figure 1:
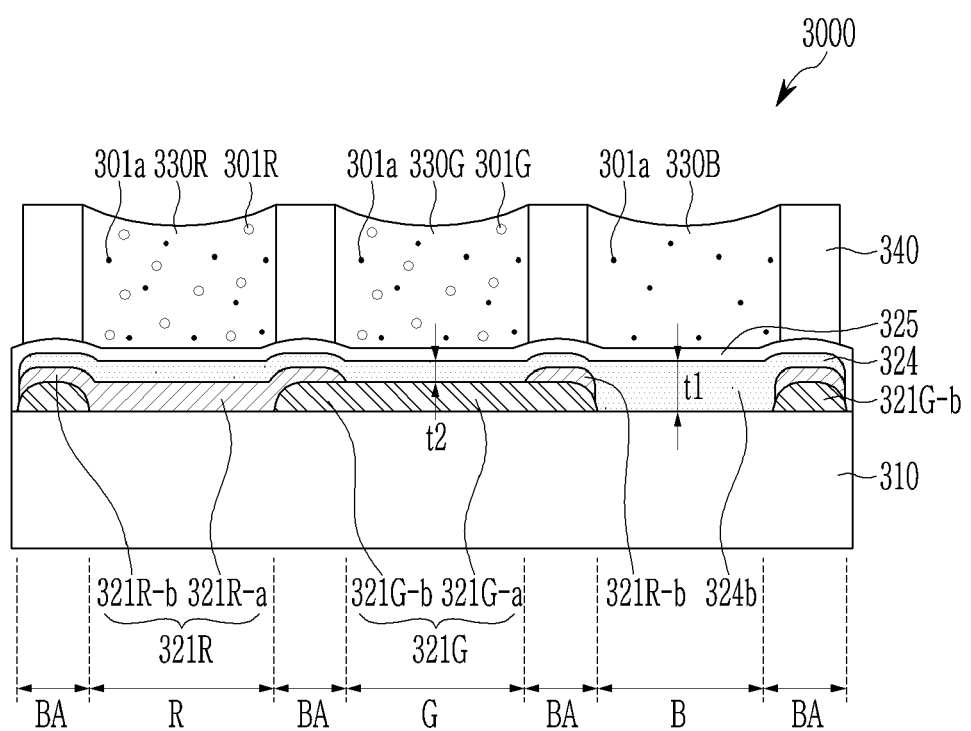
FIG. 1 illustrates a schematic cross-sectional view of a color conversion panel according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

To clearly describe the disclosure, parts that may be irrelevant to the description may be omitted, and like numerals refer to like or similar constituent elements throughout the specification.

As used herein, the singular forms "a," "an," and "the" are intended to include the plural forms as well, and vice versa, unless the context clearly indicates otherwise.

Further, since sizes and thicknesses of constituent members shown in the accompanying drawings may be arbitrarily given for better understanding and ease of description, the disclosure is not limited to the illustrated sizes and thicknesses. In the drawings, the thicknesses of layers, films, panels, regions, etc., may be exaggerated for clarity. In the drawings, for better understanding and ease of description, the thicknesses of select layers and areas may be exaggerated.

It will be understood that when an element such as a layer, film, region, or substrate is referred to as being "on" another element, it can be directly on another element or intervening elements may also be present. In contrast, when an element is referred to as being "directly on" another element, there may be no intervening elements present. Further, in the specification, the word "on" or "above" may mean positioned on or below the object portion, and does not necessarily mean positioned on the upper side of the object portion based on a gravitational direction.

Unless explicitly described to the contrary, the word "comprise", "has", "have", and "include", and variations thereof, will be understood to imply the inclusion of stated elements but not the exclusion of any other elements.

Further, in the specification, the phrase "in a plan view" means when an object portion may be viewed, e.g., from above, and the phrase "in a cross-sectional view" means when a cross-section taken by, e.g., vertically cutting an object portion may be viewed from the side.

The term "overlap" may include layer, stack, face or facing, extending over, extending under, covering or partly covering or any other suitable term as would be appreciated and understood by those of ordinary skill in the art.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The phrase "at least one of" is intended to include the meaning of "at least one selected from the group of" for the purpose of its meaning and interpretation. For example, "at least one of A and B" may be understood to mean "A, B, or A and B."

Terms such as "about", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, a color conversion panel 3000 according to an embodiment will be described with reference to FIG. 1. FIG. 1 illustrates a schematic cross-sectional view of a color conversion panel according to an embodiment.

Referring to FIG. 1, the color conversion panel 3000 according to an embodiment may include a substrate 310. The substrate 310 may include a plastic substrate that can be bent, folded, or rolled, or may include a rigid substrate, or a combination thereof.

The color conversion panel 3000 may include a red light emission area R, a green light emission area G, and a blue light emission area B. A light blocking area BA may be positioned between the red light emission area R and the green light emission area G, between the green light emission area G and the blue light emission area B, and between the blue light emission area B and the red light emission area R.

A first color filter 321R and a second color filter 321G may be positioned on the substrate 310.

The first color filter 321R may transmit red light that has passed through a first color conversion layer 330R and absorb light of remaining wavelengths, thereby increasing purity of red light emitted outside the substrate 310.

The first color filter 321R may be disposed in the red light emission area R and the light blocking area BA. The first color filter 321R may include a first-first color filter 321R-a overlapping the red light emission area R, and a first-second color filter 321R-b overlapping the light blocking area BA. The first-second color filter 321R-b may be connected to the first-first color filter 321R-a, or may be disposed in a form of an island. The first-first color filter 321R-a and the first-second color filter 321R-b may be formed in a same process.

The second color filter 321G may transmit green light and absorb light of remaining wavelengths, thereby increasing purity of green light emitted outside the substrate 310.

The second color filter 321G may be disposed in the green light emission area G and the light blocking area BA. The second color filter 321G may include a second-first color filter 321G-a overlapping the green light emission G, and a second-second color filter 321G-b overlapping the light blocking area BA. The second-second color filter 321G-b may be connected to the second-first color filter 321G-a disposed in the green light emission area G, or may be disposed in a form of an island. The second-first color filter 321G-a and the second-second color filter 321G-b may be formed in a same process.

A low refractive index layer 324 may be disposed on the substrate 310, the first color filter 321R, and the second color filter 321G. The low refractive index layer 324 may be formed to overlap a front surface of the substrate 310. The low refractive index layer 324 may overlap the red light emission area R, the green light emission area G, the blue light emission area B, and the light blocking area BA. The low refractive index layer 324 may overlap (e.g., cover) both the first color filter 321R and the second color filter 321G.

The low refractive index layer 324 may have a thickness that is greater than those of the red light emission area R and the green light emission area G in the blue light emission area B. The low refractive index layer 324 overlapping the red light emission area R and the green light emission area G may have a relatively thin thickness compared to the low refractive index layer 324 overlapping the blue light emission area B. Except for the low refractive index layer 324 overlapping the blue light emission area B, the low refractive index layer 324 may have substantially a same thickness in most areas overlapping the substrate 310.

According to an embodiment, a first thickness t1 of the low refractive index layer 324 overlapping the blue light emission area B may be in a range of about 1 to about 6 μm, e.g., about 3 to about 5 μm. A second thickness t2 of the low refractive index layer 324 overlapping the red light emission area R and the green light emission area G may be in a range of about 0.5 to about 3 μm, e.g., about 1 to about 2 μm.

The low refractive index layer 324 may have a refractive index of about 1.1 to about 1.3. The low refractive index layer 324 may include any organic material or inorganic material that satisfies the refractive index described above. However, for example, the low refractive index layer 324 may be an organic material having a high planarization characteristic while satisfying the refractive index.

The low refractive index layer 324 may include a first dye or a first pigment 324b. The first dye or first pigment 324b may absorb light having wavelength ranges other than that of blue light. Accordingly, most external light incident from the outside of the substrate 310 toward the blue light emission area B may be absorbed, and thus display quality may be prevented from deteriorating due to reflection by the external light.

The low refractive index layer 324 according to an embodiment may include about 1 wt % to about 2 wt % of the first dye or the first pigment 324b. In case that the first dye or the first pigment is included at less than about 1 wt %, an effect of reducing external light reflection may be insignificant. In case that the first dye or the first pigment is included at more than about 2 wt %, color reproducibility may be reduced in the red light emission area or the green light emission area. In general, considering that a content of the blue dye or blue pigment included in the blue color filter may be in a range of about 3 wt % to about 4 wt %, the low refractive index layer 324 according to an embodiment may include a considerably small amount of the first dye or the first pigment.

A separate color filter may not be disposed in the blue light emission area B. The low refractive index layer 324 may be in direct contact with the substrate 310.

At least two or more of the first color filter 321R, the second color filter 321G, and the low refractive index layer 324 described above may overlap in the blocking area BA. The color conversion panel 3000 according to an embodiment may provide the light blocking area BA by overlapping color filters and a low refractive index layer without a separate light blocking member.

A first insulating layer 325 may be disposed on the low refractive index 324. The first insulating layer 325 may prevent components of the first color filter 321R, the second color filter 321G, and the low refractive index layer 324 from diffusing to the outside. According to an embodiment, the first insulating layer 325 may be omitted.

A partition wall 340 may be positioned overlapping a boundary between the red light emission area R, the green light emission area G, and the blue light emission area B, for example, overlapping the light blocking area BA. The partition wall 340 may define areas in which the first color conversion layer 330R, the second color conversion layer 330G, and the transmissive layer 330B may be disposed.

The first color conversion layer 330R, the second color conversion layer 330G, and the transmissive layer 330B may be positioned in the areas defined by the partition wall 340. The first color conversion layer 330R, the second color conversion layer 330G, and the transmissive layer 330B may be formed by an inkjet process, but the disclosure is not limited thereto, and may be formed by using another manufacturing method.

The transmissive layer 330B may transmit light having a first wavelength incident from a display panel, and may include scattering bodies 301a. Light of a first wavelength may be blue light having a maximum emission peak wavelength of about 380 nm to about 480 nm, e.g., about 420 nm or more, about 430 nm or more, about 440 nm or more, or about 445 nm or more, and about 470 nm or less, about 460 nm or less, or about 455 nm or less.

The first color conversion layer 330R may color-convert light of the first wavelength incident from the display panel into red light, and may include the scattering bodies 301a and first quantum dots 301R. In this case, a maximum emission peak wavelength of red light may be in a range of about 600 nm to about 650 nm, e.g., about 620 nm to about 650 nm.

The second color conversion layer 330G may color-convert light of the first wavelength incident from the display panel into green light, and may include the scattering bodies 301a and second quantum dots 301G. The green light may have a maximum emission peak wavelength of about 500 nm to about 550 nm, e.g., about 510 nm to about 550 nm.

The scattering bodies 301a may increase light efficiency by scattering light incident onto the first color conversion layer 330R, the second color conversion layer 330G, and the transmissive layer 330B.

Each of the first quantum dots 301R and the second quantum dots 301G (hereinafter, also referred to as semiconductor nanocrystals) may independently include a Group II-VI compound, a Group III-V compound, a Group IV-VI compound, a Group IV element or compound, a Group compound, a Group compound, a I-II-IV-VI Group compound, or a combination thereof. The quantum dots may not contain cadmium.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a four-element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a group II metal (e.g., InZnP).

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof.

The Group IV element or compound may be selected from a one-element compound selected from Si, Ge, and a combination thereof; and a two-element compound selected from SiC, SiGe and a combination thereof, but the disclosure is not limited thereto.

Examples of the Group I-III-VI compound include, but are not limited to, CuInSe2, CuInS2, CuInGaSe, and CuInGaS. Examples of the I-II-IV-VI group compound include, but are not limited to, CuZnSnSe and CuZnSnS. The Group IV element or compound may be selected from a one-element compound selected from Si, Ge, and a mixture thereof; and a two-element compound selected from SiC, SiGe and a mixture thereof.

The Group II-III-VI compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but the disclosure is not limited thereto.

The Group I-II-IV-VI compound may be selected from CuZnSnSe and CuZnSnS, but the disclosure is not limited thereto.

In an embodiment, the quantum dots may not contain cadmium. The quantum dots may include semiconductor nanocrystals based on Group III-V compounds including indium and phosphorus. The Group III-V compound may further contain zinc. The quantum dots may include semiconductor nanocrystals based on a Group II-VI compound including a chalcogen element (e.g., sulfur, selenium, tellurium, or a combination thereof) and zinc.

In the quantum dots, the two-element compound, the three-element compound, and/or the four-element compound described above may be present in particles at uniform concentrations, or they may be divided into states having partially different concentrations to be present in the same particle, respectively. A core/shell structure in which select quantum dots surround select other quantum dots may be possible. An interface between the core and the shell may have a concentration gradient in which a concentration of elements of the shell decreases closer to a center thereof.

In select embodiments, the quantum dot may have a core-shell structure that includes a core including the nanocrystal described above and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or a multilayer. An interface between the core and the shell may have a concentration gradient in which a concentration of elements of the shell decreases closer to a center thereof. An example of the shell of the quantum dot may include a metal or nonmetal oxide, a semiconductor compound, or a combination thereof.

Examples of an oxide of the metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a three-element compound such as $MgAl_2O_4$, $CoFe_2O_4$, $NiFe_2O_4$, or $CoMn_2O_4$.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

An interface between the core and the shell may have a concentration gradient in which a concentration of elements of the shell decreases closer to a center thereof. The semiconductor nanocrystal may have a structure including one semiconductor nanocrystal core and a multilayered shell surrounding the semiconductor nanocrystal core. In an embodiment, the multilayered shell may have two or more layers, such as two, three, four, five, or more layers. The two adjacent layers of the shell can have a single composition or different compositions. Each layer in the multilayered shell may have a composition that varies depending on a radius.

The quantum dot may have a full width at half maximum (FWHM) of the light-emitting wavelength spectrum that may be, for example, equal to or less than about 45 nm, for another example, equal to or less than about 40 nm, or for another example, equal to or less than about 30 nm, and in this range, color purity or color reproducibility may be improved. Since light emitted through the quantum dot may be emitted in all directions, a viewing angle of light may be improved.

In the quantum dot, a shell material and a core material may have different energy bandgaps. For example, the energy bandgap of the shell material may be larger than that of the core material. In another embodiment, the energy bandgap of the shell material may be smaller than that of the core material. The quantum dot may have a multilayered shell. In the multilayered shell, the energy bandgap of an outer layer may be larger than that of an inner layer (i.e., a layer closer to the core). In the multilayered shell, the energy bandgap of the outer layer may be smaller than the energy bandgap of the inner layer.

The quantum dot may control an absorption/emission wavelength by controlling a composition and size thereof. A maximum emission peak wavelength of the quantum dot may have a wavelength range of ultraviolet rays to infrared rays or higher.

The quantum dot may include an organic ligand (e.g., having a hydrophobic moiety and/or a hydrophilic moiety). The organic ligand moiety may be bonded to a surface of the quantum dot. The organic ligand includes RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof. Herein, each R may independently indicate a C3 to C40 (e.g., C5 or more and C24 or less) substituted or unsubstituted alkyl, a C3 to C40 substituted or unsubstituted aliphatic hydrocarbon group such as a substituted or unsubstituted alkenyl, a C6 to C40 (e.g., C6 or more and C20 or less) substituted or unsubstituted aromatic hydrocarbon group such as a substituted or unsubstituted C6 to C40 aryl group, or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributylamine, and trioctylamine; a carboxylic acid compound such as methanic acid, ethanic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound or an oxide compound thereof such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide; diphenyl phosphine, a triphenyl phosphine compound, or an oxide compound thereof; or a C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid, but the disclosure is not limited thereto. The quantum dot may contain a hydrophobic organic ligand alone or as a mixture of one or more. The hydrophobic organic ligand (e.g., an acrylate group, a methacrylate group, etc.) may not contain a photopolymerizable moiety.

Although not illustrated in FIG. 1, a second insulating layer 350 (in FIG. 4) may be positioned on the first color conversion layer 330R, the second color conversion layer 330G, and the transmissive layer 330B. The second insulating layer may cover and protect the first color conversion layer 330R, the second color conversion layer 330G, and the transmissive layer 330B, to prevent a component of a filling layer, which may be injected in case that the color conversion panel 3000 may be attached to the display panel, from flowing into the first color conversion layer 330R, the second color conversion layer 330G, and the transmissive layer 330B.

The color conversion panel 3000 according to an embodiment may include a low refractive index layer 324 disposed on the first color filter 321R and the second color filter 321G while overlapping the front surface of the substrate 310. Since the low refractive index layer 324 may not require separate patterning, it may be provided through a simple process. The low refractive index layer 324 may include a dye or pigment that absorbs light other than blue light to absorb light incident from the outside of the substrate and reduce external light reflectance, thereby improving quality of the color conversion panel. The low refractive index layer 324 may overlap a red color filter and a green color filter in the light blocking area BA to replace the light blocking member, thereby simplifying a process thereof.

Figure 2:
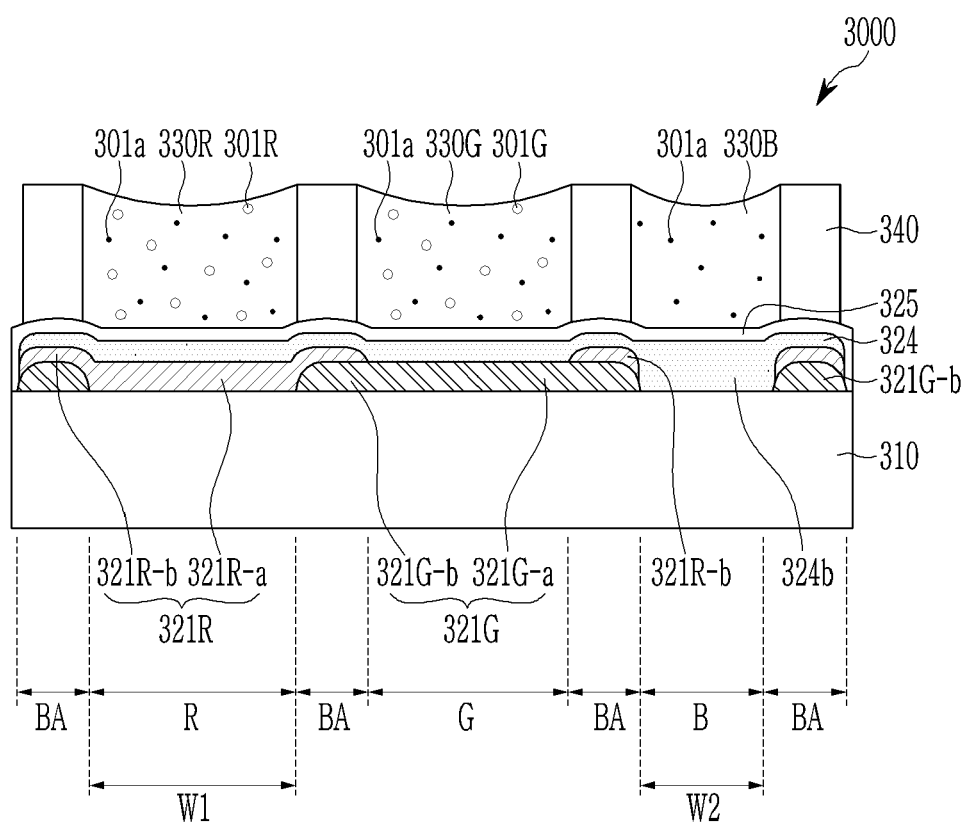
FIG. 2 illustrates a schematic cross-sectional view of a color conversion panel according to an embodiment.

A color conversion panel according to an embodiment will be described with reference to FIG. 2. FIG. 2 illustrates a schematic cross-sectional view of a color conversion panel according to an embodiment.

The first color conversion layer 330R, the second color conversion layer 330G, and the transmissive layer 330B according to an embodiment of FIG. 2 may have different areas. Specifically, a width W1 of the first color conversion layer 330R and the second color conversion layer 330G may be greater than a width W2 of the transmissive layer 330B. In a plan view, an area of the transmissive layer 330B may be smaller than that of the first color conversion layer 330R and the second color conversion layer 330G.

According to an embodiment, an area of the low refractive index layer 324 overlapping the blue light emission area B may be smaller than that of the low refractive index layer 324 overlapping the red light emission area R. The area of the low refractive index layer 324 overlapping the blue light emission area B may be smaller than that of the low refractive index layer 324 overlapping the green light emission area G.

The transmissive layer 330B may transmit (e.g., directly transmit) light supplied from the display panel, and the first color conversion layer 330R and the second color conversion layer 330G may convert and emit light supplied from the display panel. Since the first color conversion layer 330R and the second color conversion layer 330G may be provided to have a larger area than that of the transmissive layer 330B, light conversion may be performed in a larger area to emit red light or green light.

Figure 3:
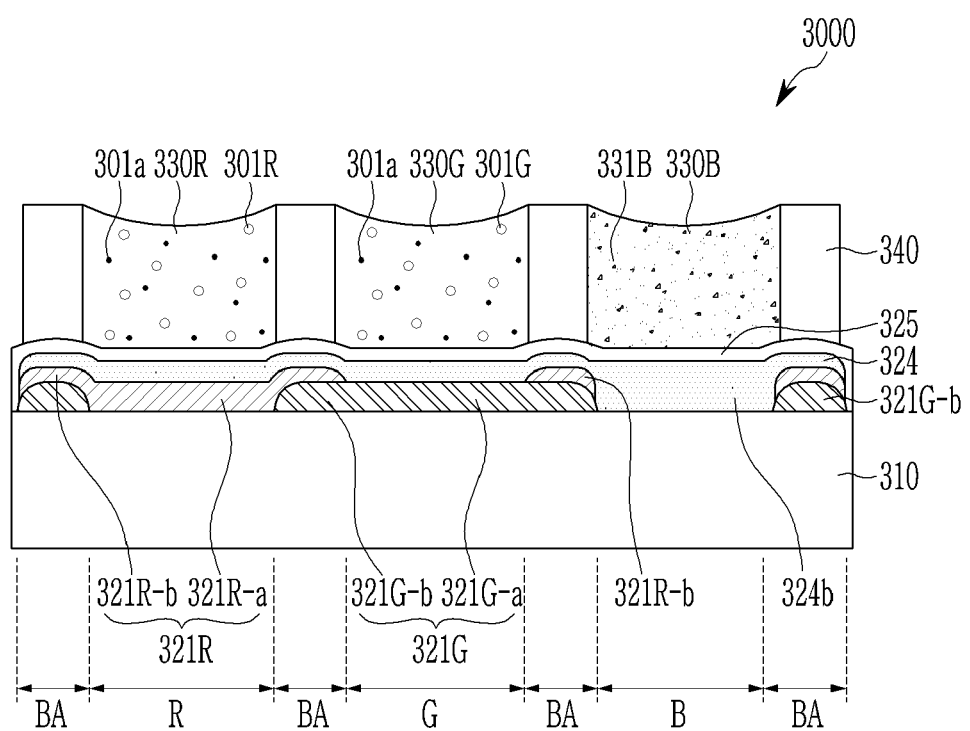
FIG. 3 illustrates a schematic cross-sectional view of a color conversion panel according to an embodiment.

A color conversion panel according to an embodiment will be described with reference to FIG. 3. FIG. 3 illustrates a schematic cross-sectional view of a color conversion panel according to an embodiment.

The transmissive layer 330B according to an embodiment of FIG. 3 may further include at least one of a second dye or a second pigment 331B. The second dye or second pigment 331B may be included in the transmissive layer 330B and may be a different material from or a same material as the first dye or the first pigment 324b included in the low refractive index layer 324.

A content of the second dye or second pigment 331B included in the transmissive layer 330B may be greater than that of the first dye or first pigment 324b included in the low refractive index layer 324.

The low refractive index layer 324 according to an embodiment may include about 1 wt % to about 2 wt % of the first dye or first pigment 324b. In case that the first dye or first pigment is included at less than about 1 wt %, an effect of reducing external light reflection may be insignificant. In case that the first dye or first pigment is included at more than about 2 wt %, color reproducibility may be reduced in the red light emission area or the green light emission area. In general, considering that a content of the blue dye or blue pigment included in the blue color filter may be in a range of about 3 wt % to about 4 wt %, the low refractive index layer 324 according to an embodiment may include a considerably small amount of the first dye or the first pigment.

The low refractive index layer 324 may effectively reduce external light reflection while having a small effect on light emitted from the color conversion panel by including a relatively small amount of dye or pigment.

A display device according to an embodiment will now be described with reference to FIG. 4. A description of the same or similar elements as those described above will be omitted.

Figure 4:
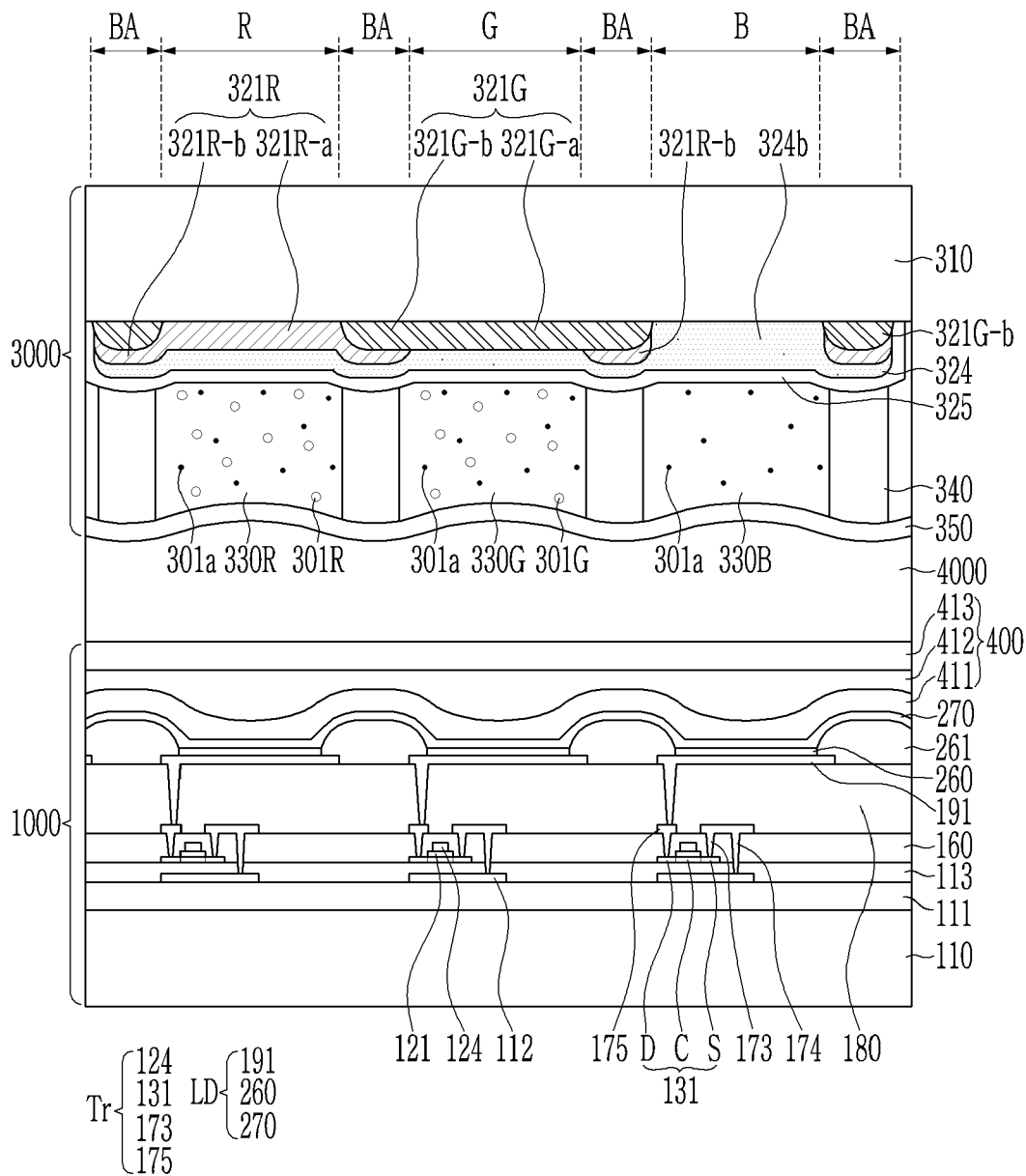
FIG. 4, FIG. 5, FIG. 6, FIG. 7, FIG. 8, and FIG. 9 respectively illustrate schematic cross-sectional views of a display device according to an embodiment.

Referring to FIG. 4, a display device according to an embodiment may include a display panel 1000 and the color conversion panel 3000. Although not shown, the display device may further include a touch unit, and the touch unit may be disposed between the display panel 1000 and the color conversion panel 3000 or on the color conversion panel 3000.

The display panel 1000 according to an embodiment may include a first substrate 110, and a buffer layer 111 may be disposed on the first substrate 110. The first substrate 110 may include a plastic substrate that can be curved, bent, and folded or rolled, or may include a rigid substrate, or a combination thereof.

The buffer layer 111 may include a silicon nitride ($SiN_x$), a silicon oxide ($SiO_2$), or the like, or a combination thereof. The buffer layer 111 may be disposed between the first substrate 110 and a semiconductor layer 131 to improve a characteristic of polysilicon by blocking impurities introduced from the first substrate 110 and to relieve a stress of the semiconductor layer 131 disposed on the buffer layer 111 by flattening the first substrate 110 during a crystallization process to form a polysilicon.

A metal layer 112 and an insulating layer 113 may be disposed on the buffer layer 111. The metal layer 112 may prevent external light from reaching the semiconductor layer 131, thereby preventing deterioration of the characteristic of the semiconductor layer 131. The metal layer 112 may include, e.g., a metal, a metal alloy, a conductive material equivalent to a metal, or a combination thereof.

The metal layer 112 may receive a voltage from a region 174 extending from the source electrode 173 to be described later. Accordingly, a current change rate may be reduced, and characteristics such as a driving transistor may be improved in a saturation region of a voltage-current characteristic graph of the transistor TR. However, the metal layer 112 is not limited thereto, and may be connected to another signal line, or may be in a floating state.

The insulating layer 113 may include a silicon nitride ($SiN_x$), a silicon oxide ($SiO_2$), or the like, or a combination thereof.

A semiconductor layer 131 may be disposed on the insulating layer 113. The semiconductor layer 131 may include at least one of polysilicon and an oxide semiconductor. The semiconductor layer 131 may include a channel region C, a source region S, and a drain region D. The source region S and the drain region D may be positioned at opposite sides of the channel region C, respectively. The channel region C may include an intrinsic semiconductor that may not be doped with an impurity, and the source region S and the drain region D may include an impurity semiconductor doped with a conductive impurity. The semiconductor layer 131 may be formed by using an oxide semiconductor, and a separate protective layer (not illustrated) may be added to protect an oxide semiconductor material that may be vulnerable to external environments such as a high temperature.

A gate insulating layer 121 overlapping the channel region C may be disposed on the semiconductor layer 131. The gate insulating layer 121 may be a single layer or multiple layers including at least one of a silicon nitride ($SiN_x$) and a silicon oxide ($SiO_2$).

A gate electrode 124 may be disposed on the gate insulating layer 121. The gate electrode 124 may be a single layer or a multilayer in which a metal film including any one of copper (Cu), a copper alloy, aluminum (Al), an aluminum alloy, molybdenum (Mo), and a molybdenum alloy may be stacked on each other.

An interlayer insulating layer 160 may be disposed on the gate electrode 124 and the gate insulating layer 121. The interlayer insulating layer 160 may be made of a silicon nitride ($SiN_x$), a silicon oxide ($SiO_2$), or the like, or an organic material.

The source electrode 173 and the drain electrode 175 may be disposed on the interlayer insulating layer 160. The source electrode 173 and the drain electrode 175 may be connected to the source region S and the drain region D of the semiconductor layer 131 through contact holes formed in the interlayer insulating layer 160 and the gate insulating layer 121, respectively.

A passivation layer 180 may be disposed on the interlayer insulating layer 160, the source electrode 173, and the drain electrode 175. The passivation layer 180 may be made of an organic material such as a polyacrylate resin or a polyimide resin, a stacked layer of organic and inorganic materials, or an inorganic layer.

A pixel electrode 191 may be disposed on the passivation layer 180. The pixel electrode 191 may be connected to the drain electrode 175 through a contact hole of the passivation layer 180.

The transistor Tr formed to include the gate electrode 124, the semiconductor layer 131, the source electrode 173, and the drain electrode 175 may be connected to the pixel electrode 191 to supply a current to the light emitting element LD.

A partition wall 261 may be positioned on the passivation layer 180 and the pixel electrode 191, and may have an opening that overlaps the pixel electrode 191 and defines an emission area. The opening may have a planar shape that may be substantially similar to that of the pixel electrode 191. The opening may have a rhombus or an octagonal shape that may be similar to a rhombus in a plan view, but the disclosure is not limited thereto, and may have any shape such as a square or a polygon.

The partition wall 261 may include an organic material such as a polyacrylate resin, a polyimide resin, or a combination thereof, a silica-based inorganic material, or a combination thereof.

An emission layer 260 may be disposed on the pixel electrode 191 overlapping the opening. The emission layer 260 may be formed to include a low molecular organic material or a polymer organic material such as poly(3,4-ethylenedioxythiophene) (PEDOT). The emission layer 260 may be a multilayer further including at least one of a hole injection layer (HIL), a hole transporting layer (HTL), an electron transporting layer (ETL), and an electron injection layer (EIL).

Most of the emission layer 260 may be positioned within the opening, and may also be positioned on a side surface of the partition wall 261 or on the partition wall 261.

A common electrode 270 may be disposed on the emission layer 260. The common electrode 270 may be disposed across pixels, and may receive a common voltage through a common voltage transfer unit (not illustrated) in a non-display area.

The pixel electrode 191, the emission layer 260, and the common electrode 270 may constitute a light emitting diode LD.

Herein, the pixel electrode 191 may be an anode which may be a hole injection electrode, and the common electrode 270 may be a cathode which may be an electron injection electrode. However, embodiments are not limited thereto, and the pixel electrode 191 may be a cathode and the common electrode 270 may be an anode depending on a driving method of an emissive display device.

In case that holes and electrons are injected from the pixel electrode 191 and the common electrode 270 into the emission layer 260, excitons formed by combining the injected holes and electrons may be emitted in case that they fall from an excited state to a ground state.

An encapsulation layer 400 may be disposed on the common electrode 270. The encapsulation layer 400 may cover and seal not only an upper surface of the light emitting diode LD, but also a side surface thereof. Since the light emitting diode LD may be very vulnerable to moisture and oxygen, the encapsulation layer 400 may seal the light emitting diode LD to block inflow of moisture and oxygen from the outside.

The encapsulation layer 400 may include layers, may be formed by using a composite layer including all inorganic layers 411 and 413 and an organic layer 412 among the layers, and may be formed as a triple layer in which the first inorganic layer 411, the organic layer 412, and the second inorganic layer 413 may be sequentially formed.

The color conversion panel 3000 described in FIG. 1 may be disposed on the encapsulation layer 400. A detailed description thereof will be omitted.

A filling layer 4000 may be disposed between the display panel 1000 and the color conversion panel 3000. After manufacturing each of the display panel 1000 and the color conversion panel 3000, they may be arranged to face each other, and the filling layer 4000 may be filled between the display panel 1000 and the color conversion panel 3000 to manufacture the display device.

In the specification, an embodiment in which the display panel 1000 may be a light emitting display panel has been illustrated and described. However, a type of the display panel 1000 is not limited thereto, and the display panel may be formed as various types of panels. For example, the display panel 1000 may be formed as a liquid crystal display panel, an electrophoretic display panel, an electrowetting display panel, or the like. The display panel 1000 may be formed as a next-generation display panel such as a micro light emitting diode (micro LED) display panel, a quantum dot light emitting diode (QLED) display panel, or a quantum dot organic light emitting diode (QD-OLED) display panel.

A display device according to an embodiment will now be described with reference to FIG. 5. A description of the same or similar elements as those described above will be omitted.

Figure 5:
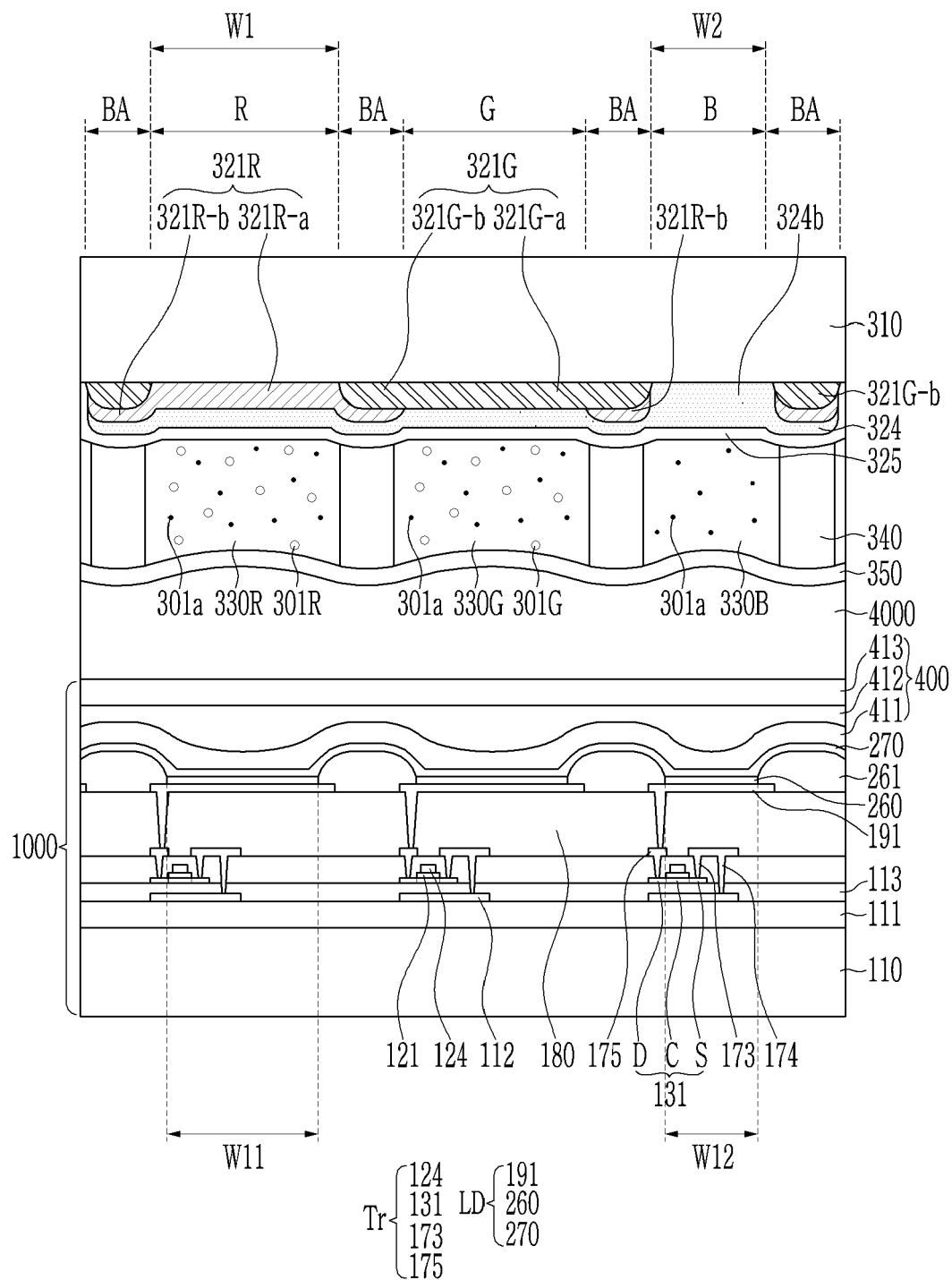

The first color conversion layer 330R, the second color conversion layer 330G, and the transmissive layer 330B according to an embodiment of FIG. 5 may have different areas. Specifically, a width W1 of the first color conversion layer 330R and the second color conversion layer 330G may be greater than a width W2 of the transmissive layer 330B. In a plan view, an area of the transmissive layer 330B may be smaller than that of the first color conversion layer 330R and the second color conversion layer 330G.

According to an embodiment, an area of the low refractive index layer 324 overlapping the blue light emission area B may be smaller than that of the low refractive index layer 324 overlapping the red light emission area R. The area of the low refractive index layer 324 overlapping the blue light emission area B may be smaller than that of the low refractive index layer 324 overlapping the green light emission area G.

The transmissive layer 330B may transmit (e.g., directly transmit) light supplied from the display panel 1000, and the first color conversion layer 330R and the second color conversion layer 330G may convert and emit light supplied from the display panel 1000. Since the first color conversion layer 330R and the second color conversion layer 330G may be provided to have a larger area than that of the transmissive layer 330B, light conversion may be performed in a larger area to emit red light or green light.

The emission layer 260 overlapping the color conversion layers 330R and 330G and the emission layer 260 overlapping the transmissive layer 330B may have different areas. An area W11 of the emission layer 260 overlapping the color conversion layers 330R and 330G may be larger than an area W12 of the emission layer 260 overlapping the transmissive layer 330B. An amount of light supplied to the color conversion layers 330R and 330G may be greater than that light supplied to the transmissive layer 330B.

The area W11 occupied by the emission layer 260 disposed in the red light emission area R and an area W1 occupied by the first color conversion layer 330R may be different. The area W1 occupied by the first color conversion layer 330R may be larger than the area W11 occupied by the emission layer 260. Similarly, an area occupied by the second color conversion layer 330G may be larger than an area occupied by the emission layer 260 overlapping the green light emission area G. An area W2 occupied by the transmissive layer 330B may be larger than the area W12 occupied by the emission layer 260 overlapping the blue light emission area B. Accordingly, even in case that misalignment occurs in a process of bonding the display panel 1000 and the color conversion panel 3000 to each other, color mixing may be prevented.

Figure 6:
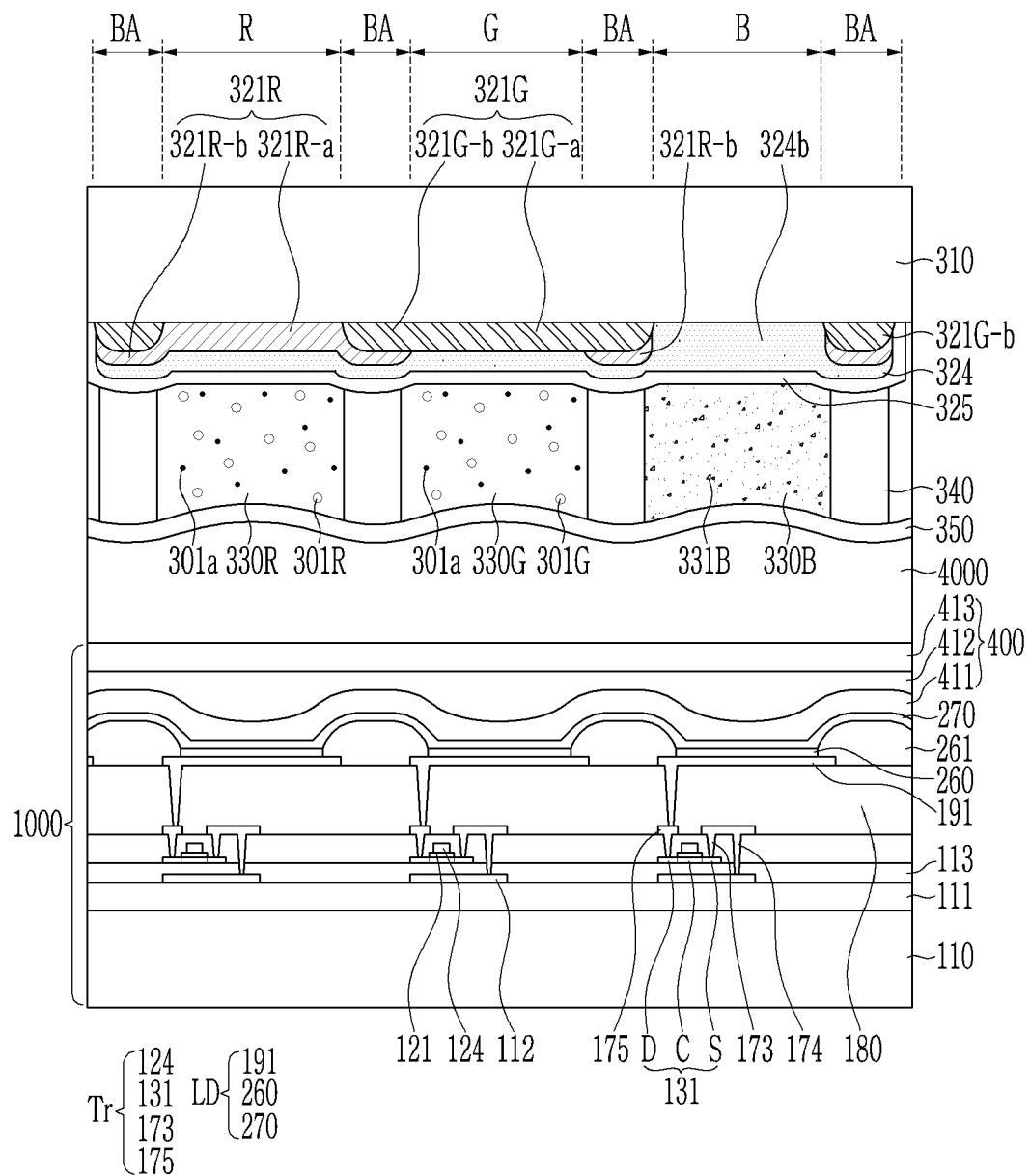

A display device according to an embodiment will now be described with reference to FIG. 6. FIG. 6 illustrates a schematic cross-sectional view of a display device according to an embodiment.

The transmissive layer 330B according to an embodiment of FIG. 6 may further include at least one of a second dye or a second pigment 331B. The second dye or second pigment 331B included in the transmissive layer 330B may be a different material from or a same material as the first dye or the first pigment 324b included in the low refractive index layer 324.

A content of the second dye or the second pigment 331B included in the transmissive layer 330B may be greater than that of the first dye or the first pigment 324b included in the low refractive index layer 324. The low refractive index layer 324 may effectively reduce external light reflection while having a small effect on light emitted from the color conversion panel by including a relatively small amount of dye or pigment.

Figure 7:
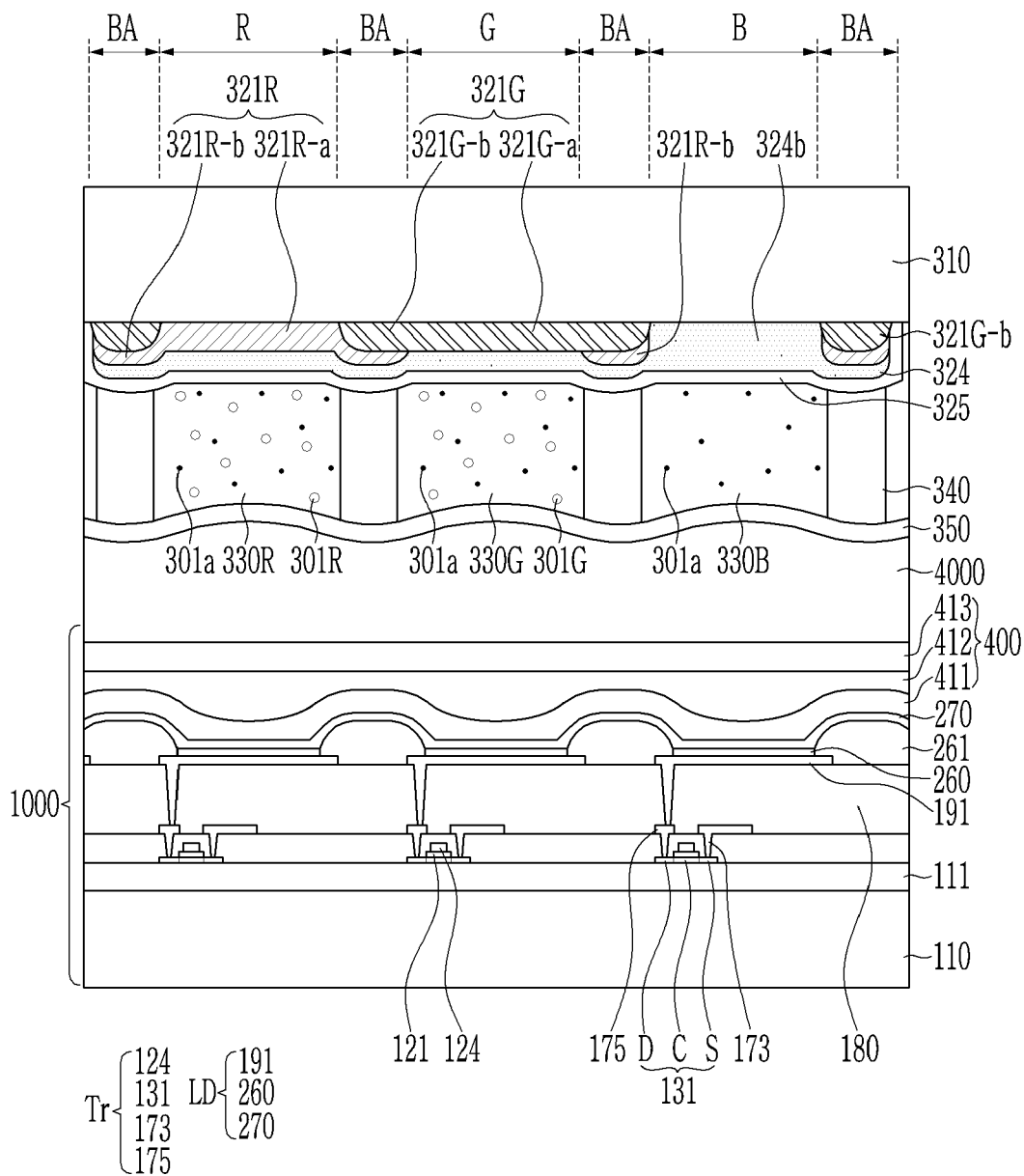
Figure 8:
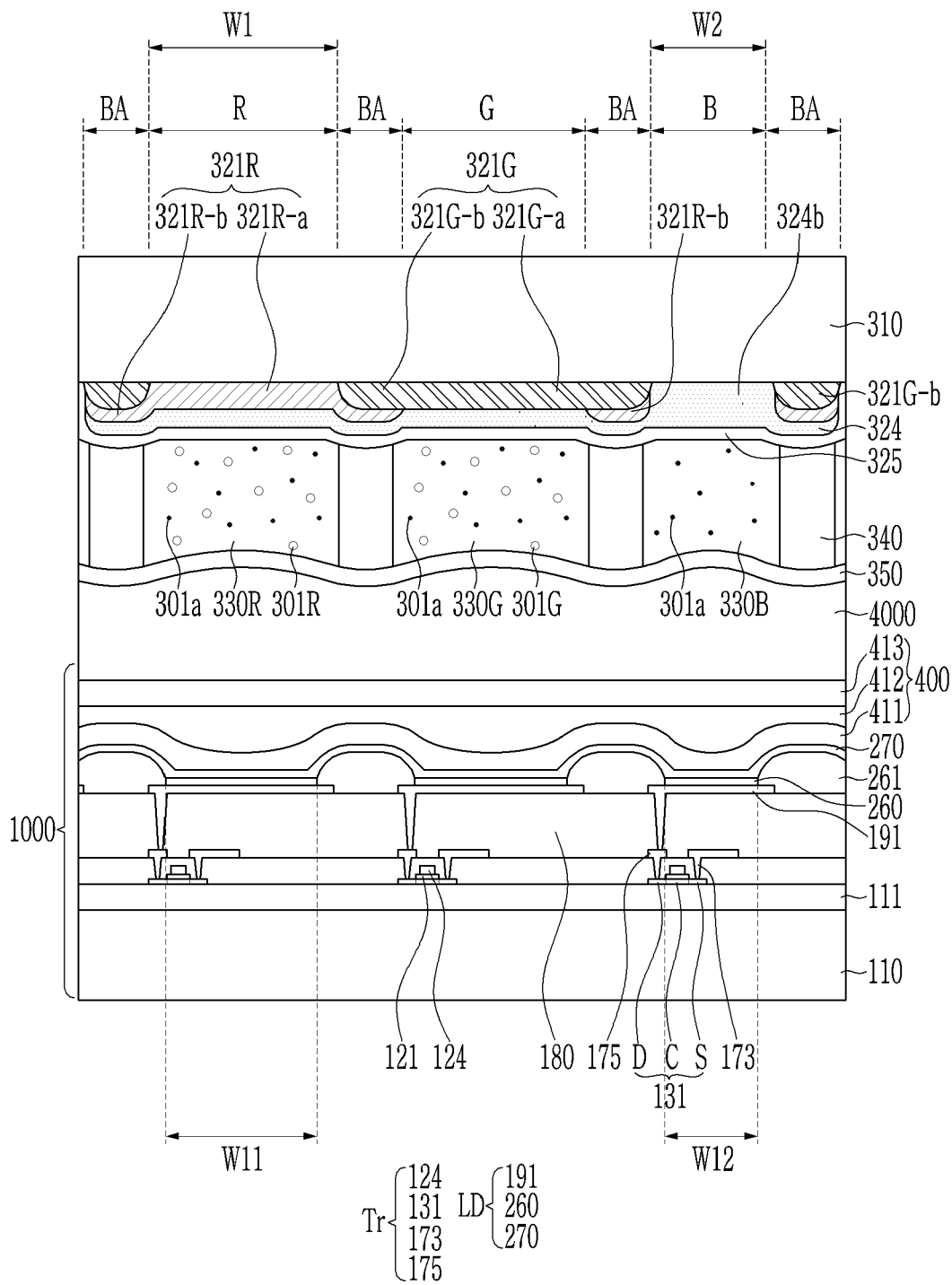
Figure 9:
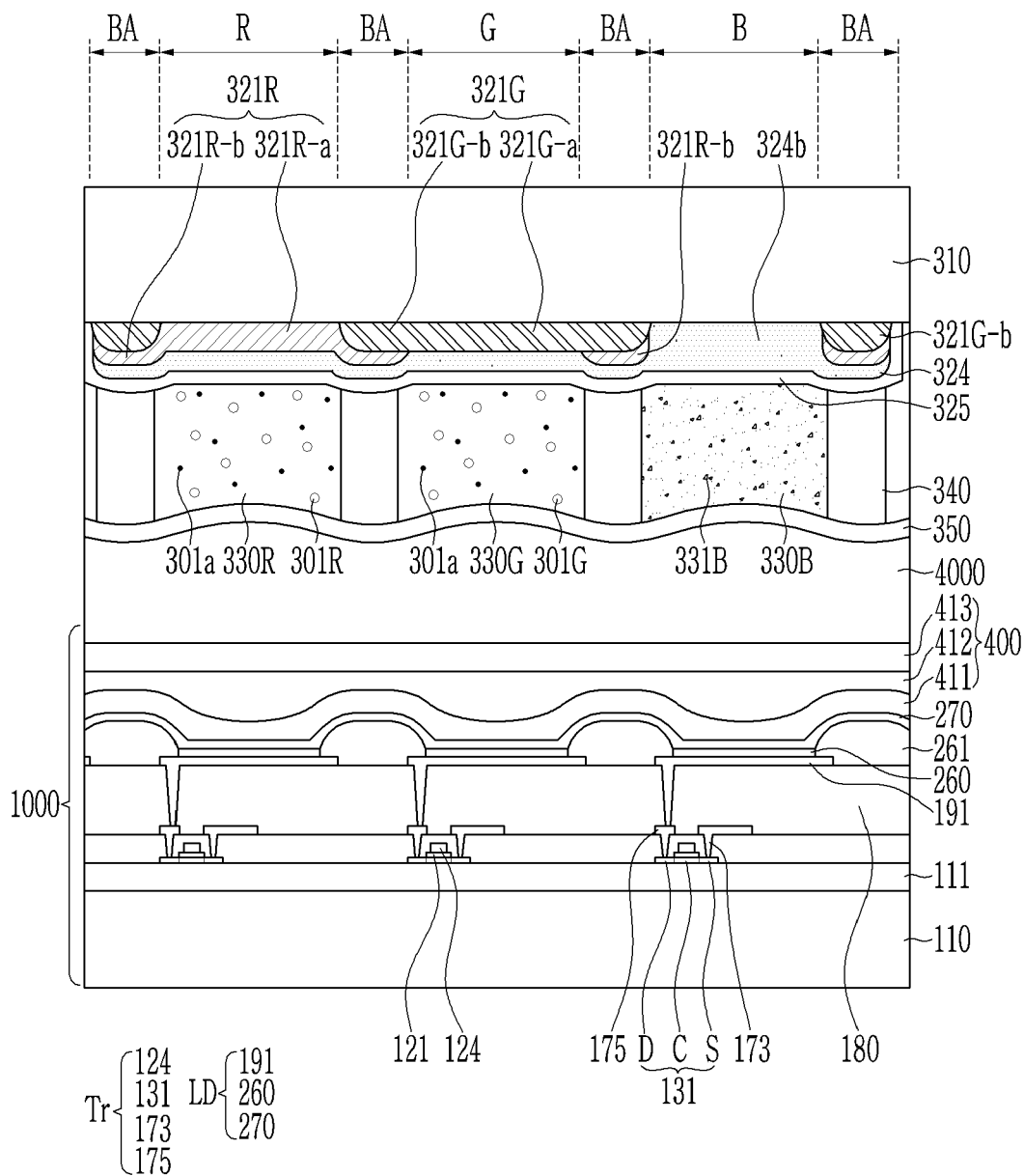

A display device according to an embodiment will now be described with reference to FIG. 7, FIG. 8, and FIG. 9. FIG. 7, FIG. 8, and FIG. 9 illustrate schematic cross-sectional views of a display device.

Referring to FIG. 7, unlike an embodiment of FIG. 4, the display panel 1000 according to an embodiment may include a buffer layer 111 disposed on (e.g., directly on) the first substrate 110 and a semiconductor layer 131 disposed on (e.g., directly on) the buffer layer 111. Other constituent elements may be the same as those in FIG. 4.

Referring to FIG. 8, unlike an embodiment of FIG. 5, the display panel 1000 according to an embodiment may include a buffer layer 111 disposed on (e.g., directly on) the first substrate 110 and a semiconductor layer 131 disposed on (e.g., directly on) the buffer layer 111. Other constituent elements may be the same as those in FIG. 5.

Referring to FIG. 9, unlike an embodiment of FIG. 6, the display panel 1000 according to an embodiment may include a buffer layer 111 disposed on (e.g., directly on) the first substrate 110 and a semiconductor layer 131 disposed on (e.g., directly on) the buffer layer 111. Other constituent elements may be the same as those in FIG. 6.

Figure 10:
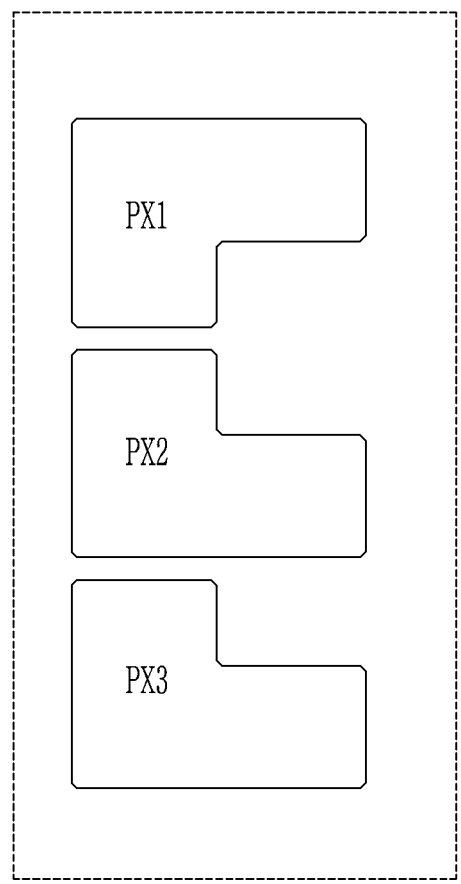
FIG. 10 and FIG. 11 each illustrates a schematic top plan view of select pixels of a display device according to an embodiment.
Figure 11:
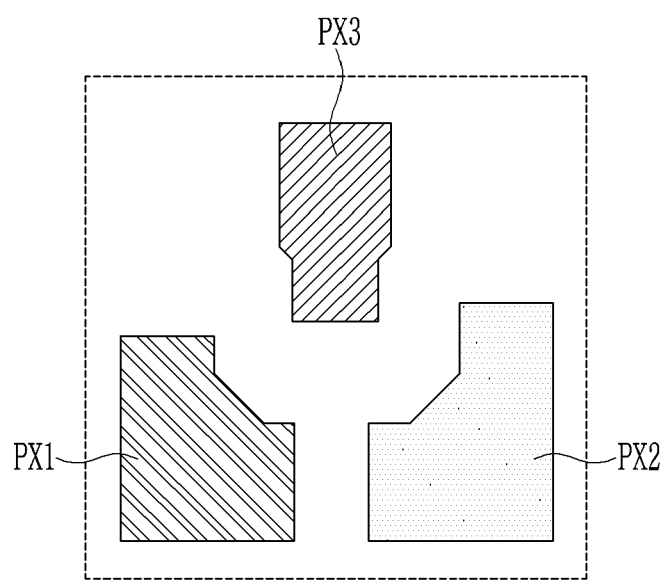

A schematic plane of a display device according to an embodiment will now be described with reference to FIG. 10 and FIG. 11. FIG. 10 and FIG. 11 each illustrates a schematic top plan view of select pixels of a display device.

As illustrated in each of FIG. 10 and FIG. 11, the display device according to an embodiment may include pixels PX1, PX2, and PX3. The first pixel PX1 may be a pixel displaying red, the second pixel PX2 may be a pixel displaying green, and the third pixel PX3 may be a pixel displaying blue.

As illustrated in FIG. 10, the pixels PX1, PX2, and PX3 may have a same area, or as illustrated in FIG. 11, the pixels PX1, PX2, and PX3 may have different areas. For example, an area of the third pixel PX3 that may represent blue may be smaller than that of the first pixel PX1 that may represent red and the second pixel PX2 that may represent green.

As illustrated in FIG. 10 and FIG. 11, the pixels PX1, PX2, and PX3 may have various planar shapes and planar arrangements, but the disclosure is not limited thereto.

Figure 12:
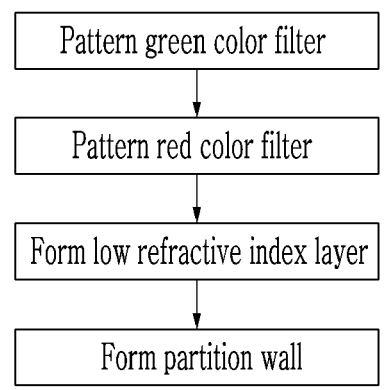
FIG. 12 illustrates a schematic flowchart showing a manufacturing process of a color conversion panel according to an embodiment.

A manufacturing method of a display device according to an embodiment will now be described with reference to FIG. 12 to FIG. 17. FIG. 12 illustrates a schematic flowchart showing a manufacturing method of a color conversion panel according to an embodiment, and FIG. 13, FIG. 14, FIG. 15, FIG. 16, and FIG. 17 respectively illustrate schematic cross-sectional views of a color conversion panel depending on the manufacturing method.

Figure 13:
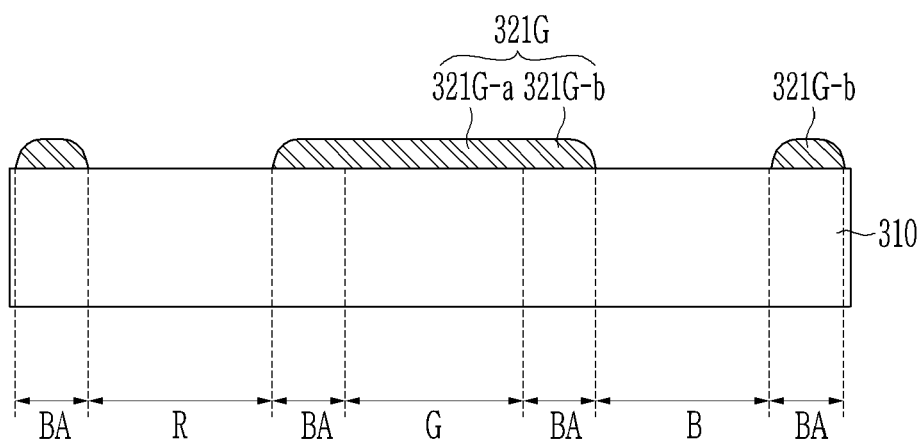
FIG. 13, FIG. 14, FIG. 15, FIG. 16, and FIG. 17 respectively illustrate schematic cross-sectional views showing a manufacturing process of a color conversion panel according to an embodiment.

First, referring to FIG. 12 and FIG. 13, a second color filter 321G may be disposed on a substrate 310. The second color filter 321G may be disposed in the green light emission area G and the light blocking area BA. Specifically, the second color filter 321G may be formed to include a second-first color filter 321G-a overlapping the green light emission G, and a second-second color filter 321G-b overlapping the light blocking area BA.

Figure 14:
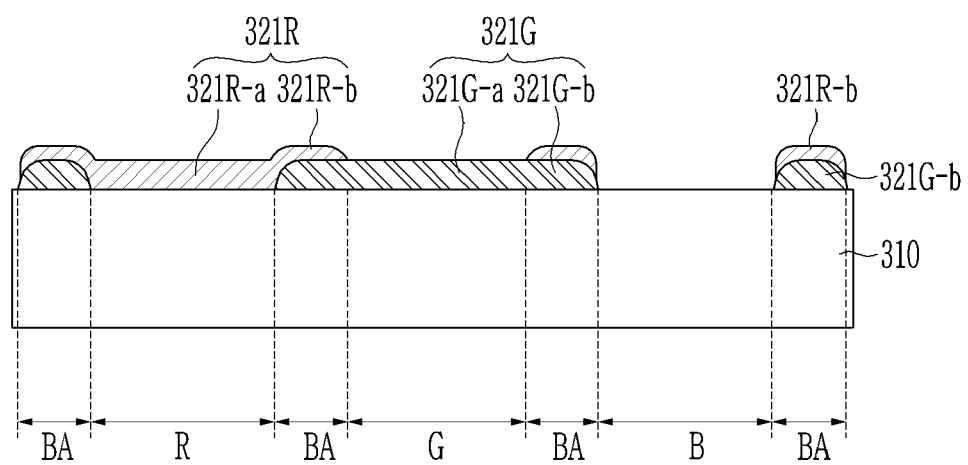

Referring to FIG. 12 and FIG. 14, a first color filter 321R may be disposed on the substrate 310 and the second color filter 321G. Although the specification shows an embodiment in which the second color filter 321G may be formed first, and the first color filter 321R may be formed, the disclosure is not limited thereto, and it shall be obvious that the second color filter 321G may be formed after the first color filter 321R may be formed.

The first color filter 321R may overlap the red light emission area R and the light blocking area BA. Specifically, the first color filter 321R may be formed to include a first-first color filter 321R-a overlapping the red light emission area R, and a first-second color filter 321R-b overlapping the light blocking area BA. The first-second color filter 321R-b may overlap the second-second color filter 321G-b in the light blocking area BA.

Figure 15:
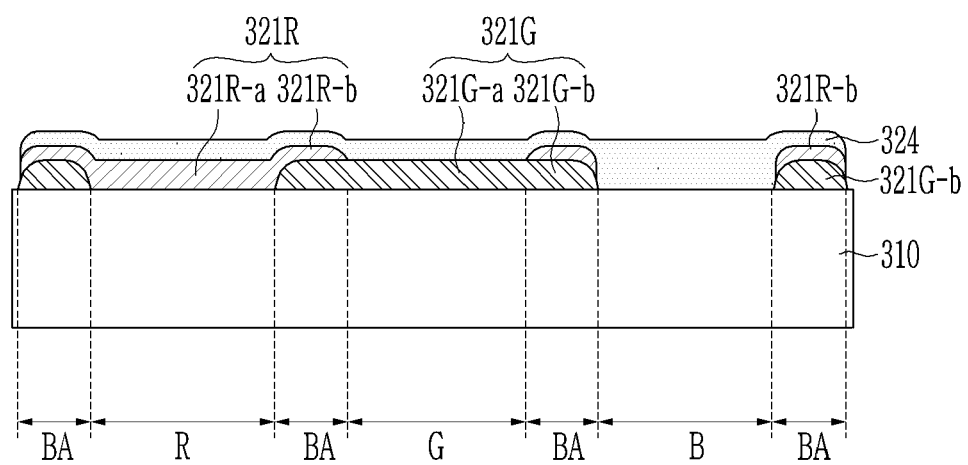

Referring to FIG. 12 and FIG. 15, a low refractive index layer 324 may be disposed on the substrate 310, the second color filter 321G, and the first color filter 321R. The low refractive index layer 324 may be formed to overlap a front surface of the substrate 310. The low refractive index layer 324 may overlap the red light emission area R, the green light emission area G, the blue light emission area B, and the light blocking area BA. The low refractive index layer 324 may cover both the first color filter 321R and the second color filter 321G.

The low refractive index layer 324 may have a thickness that may be greater than those of the red light emission area R and the green light emission area G in the blue light emission area B. The low refractive index layer 324 overlapping the red light emission area R and the green light emission area G may have a relatively thin thickness compared to the low refractive index layer 324 overlapping the blue light emission area B. Except for the low refractive index layer 324 overlapping the blue light emission area B, the low refractive index layer 324 may have substantially a same thickness in most areas overlapping the substrate 310.

Figure 16:
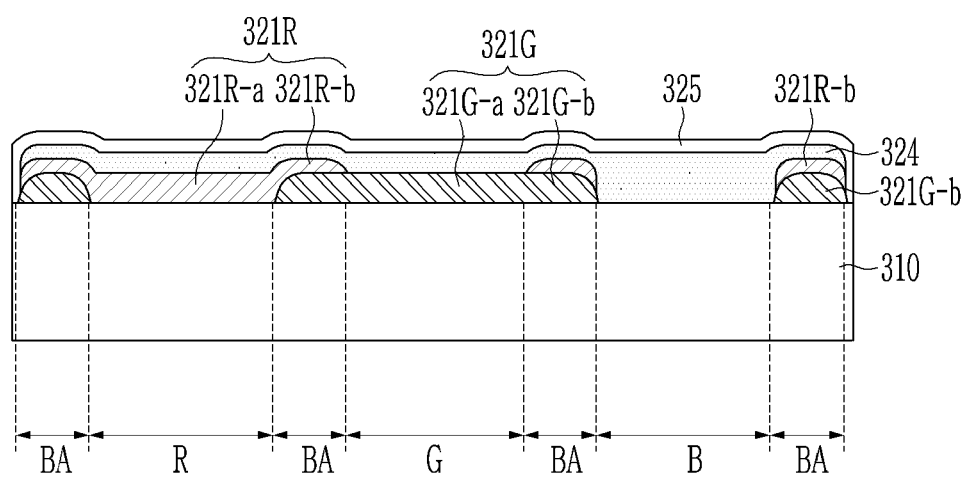

As illustrated in FIG. 16, a first insulating layer 325 may be disposed on the low refractive index layer 324. The first insulating layer 325 may prevent components of the first color filter 321R, the second color filter 321G, and the low refractive index layer 324 from diffusing to the outside.

Figure 17:
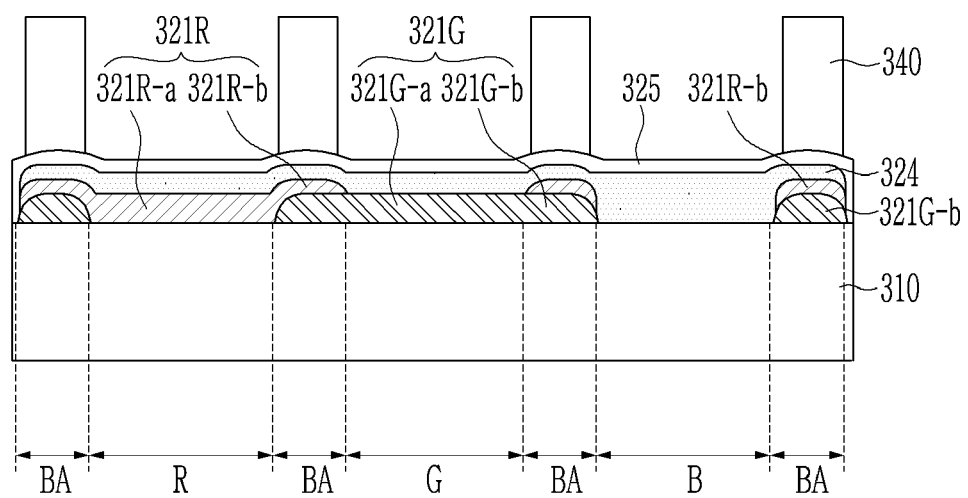

Referring to FIG. 12 and FIG. 17, a partition wall 340 may be disposed on the first insulating layer 325 overlapping the light blocking area BA. The partition wall 340 may be positioned on a boundary of the red light emission area R, the green light emission area G, and the blue light emission area B. The partition wall 340 may define an area in which the first color conversion layer, the second color conversion layer, and the transmissive layer may be disposed.

Thereafter, each of the first color conversion layer 330R, the second color conversion layer 330G, and the transmissive layer 330B may be formed on the area separated by the partition wall 340 to provide the color conversion panel 3000 as illustrated in FIG. 1.

In the color conversion panel according to an embodiment, reflectance and color reproduction rate were examined in the case where a content of the first dye or the first pigment 324b included in the low refractive index layer 324 may be about 1.13 wt % as Example 1 and in the case where the content of the first dye or the first pigment 324b included in the low refractive index layer 324 may be about 1.58 wt % as Example 2.

It was confirmed that both Example 1 and Example 2 showed good reflectance of around 1% based on SCI, SCE, and SC indicators representing reflectance, and BT 2020, which represents the color gamut, showed about 93%, and DCI showed about 99.9%, which showed an excellent color gamut.

TABLE 1

|  | Example 1 | Example 2 |
| --- | --- | --- |
| SCI | 1.03% | 099% |
| SCE | 0.47% | 0.44% |
| SC | 0.55% | 0.55% |
| BT 2020 | 93% | 93% |
| DCI | 99.9% | 99.9% |

Figure 18:
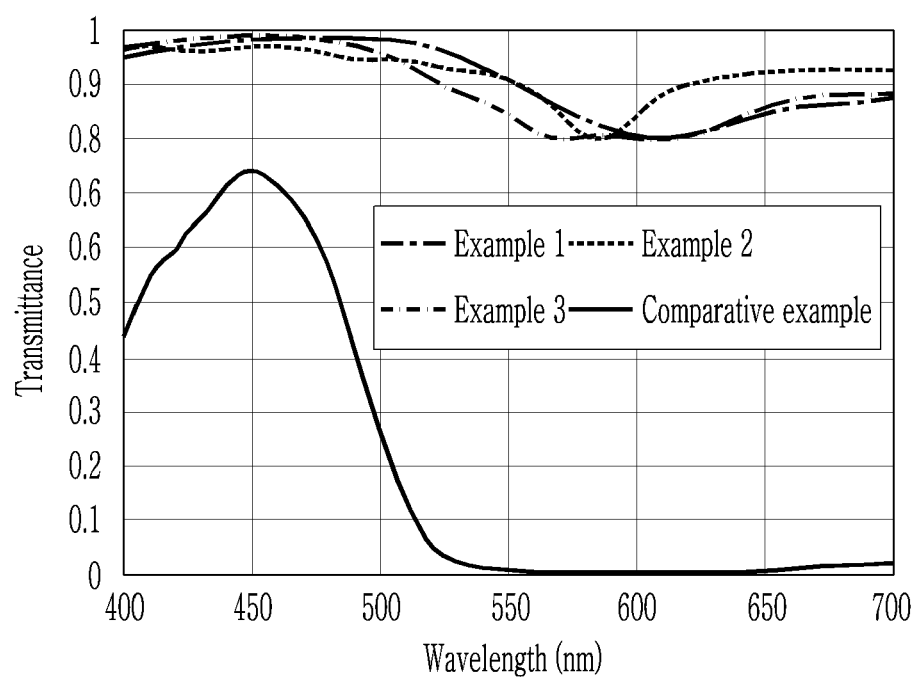
FIG. 18 illustrates a schematic graph showing transmittance of a low refractive index layer according to an example and a blue color filter according to a comparative example.
Figure 19:
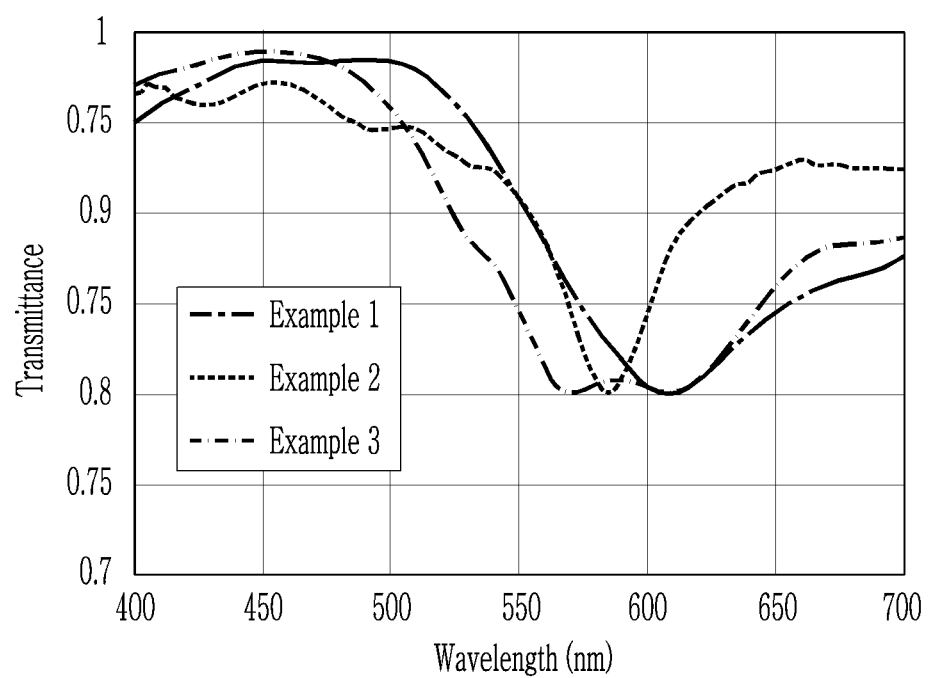
FIG. 19 illustrates a schematic graph showing transmittance of a low refractive index layer according to an example.

According to an embodiment, in manufacturing the color conversion panel 3000, it may be possible to provide a color conversion panel with reduced reflectance even in case that a small mask may be used. This will be described with reference to FIG. 18 and FIG. 19. FIG. 18 illustrates a schematic graph showing transmittance of a low refractive index layer according to an example and a blue color filter according to a comparative example, and FIG. 19 illustrates a schematic graph showing transmittance of a low refractive index layer according to an example. In FIG. 18 and FIG. 19, each of Examples 1 to 3 shows a low refractive index layer in which a content of dye or pigment or a material constituting a low refractive index layer may be partially different.

Referring to FIG. 18, it can be seen that Examples 1 to 3 exhibit higher transmittance than other wavelength bands in a blue light wavelength region (500 nm or less). This may be because the low refractive index layers according to Examples 1 to 3 may include a dye or pigment, and the dye or pigment absorbs light in the remaining wavelength bands excluding blue light. However, it can be seen that the transmittance may be in a range of about 0.8 to 0.9 even in the wavelength band of 500 nm or more.

On the other hand, in the case of a comparative example including a blue color filter, it can be seen that it shows maximum transmittance of 0.7 to 0.8 in a wavelength band of 500 nm or less, but it shows that transmittance may be almost zero in a wavelength band above 500 nm.

The low refractive index layer according to an embodiment may overlap not only the blue light emission area but also the red light and green light emission areas. In the blue light emission area, since the low refractive index layer can absorb light (except blue light) incident from the outside of the substrate and reduce reflectance of external light, quality of the color conversion panel may be improved. It can be seen that even in case overlapped with the red and green light emission areas, the transmittance in the red and green light wavelength bands may not be low, so it may hardly affect the emission of red and green light.

In the case of Examples 1 to 3, an overall transmittance aspect may be similar. However, as illustrated in FIG. 19, a difference between the transmittance of a half-width to blue light wavelength band and the transmittance of the red light wavelength band may be partially different. For example, the half width may be relatively narrowest in Example 2. The low refractive index layer according to Example 2 may have a least difference between the transmittance in the blue light wavelength band and the transmittance in the red light wavelength band. It may be natural that any of the low refractive index layers of Examples 1 to 3 can be applied to the color conversion panel according to an embodiment, and any one low refractive index layer may be used in the display device according to an embodiment in consideration of the above-described difference in transmittance or half width.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims, including equivalents thereof.

What is claimed is:

1. A color conversion panel comprising:
   a first color filter and a second color filter that are disposed on a substrate;
   a light emission area;
   a low refractive index layer disposed on the substrate, directly over a center of an emission area of the first color filter in a thickness direction perpendicular to a front surface of the substrate, directly over a center of an emission area of the second color filter in the thickness direction perpendicular to the front surface of the substrate, and directly over a center of the light emission area in the thickness direction perpendicular to the front surface of the substrate, the low refractive index layer including at least one of a first blue pigment and a first blue dye;
   a first color conversion layer overlapping the first color filter and including a semiconductor nanocrystal;
   a second color conversion layer overlapping the second color filter and including a semiconductor nanocrystal; and
   a transmissive layer that overlaps the low refractive index layer, wherein
   a first thickness of the low refractive index layer overlapping the light emission area is different from a second thickness of the low refractive index layer overlapping the emission area of the first color filter.

2. The color conversion panel of claim 1, wherein
   the emission area of the first color filter is a red light emission area,
   the emission area of the second color filter is a green light emission area, and
   the light emission area is a blue light emission area, and the color conversion panel includes a light blocking area.

3. The color conversion panel of claim 2, wherein the first color filter includes:
   a first-first color filter that overlaps the red light emission area; and
   a first-second color filter that overlaps the light blocking area.

4. The color conversion panel of claim 3, wherein the second color filter includes:
   a second-first color filter that overlaps the green light emission area; and
   a second-second color filter that overlaps the light blocking area.

5. The color conversion panel of claim 4, wherein the first-second color filter, the second-second color filter, and the low refractive index layer overlap in the light blocking area.

6. The color conversion panel of claim 1, wherein
   the first thickness is in a range of about 1 μm to about 6 μm, and
   the second thickness is in a range of about 0.5 μm to about 3 μm.

7. The color conversion panel of claim 1, wherein
   a content of the first blue pigment or first blue dye included in the low refractive index layer is in a range of about 1 wt % to about 2 wt %.

8. The color conversion panel of claim 1, wherein
   the transmissive layer includes a second blue pigment or a second blue dye.

9. The color conversion panel of claim 8, wherein
   a content of the second blue pigment or the second blue dye included in the transmissive layer is greater than a content of the first blue pigment or the first blue dye included in the low refractive index layer.

10. The color conversion panel of claim 1, wherein
    a refractive index of the low refractive index layer is in a range of about 1.1 to about 1.3.

11. A display device comprising:
    a display panel; and
    a color conversion panel that overlaps the display panel, wherein the color conversion panel includes:
       a substrate that overlaps the display panel;
       a first color filter and a second color filter that are disposed between the substrate and the display panel;
       a light emission area;
       a low refractive index layer disposed on the substrate, directly over a center of an emission area of the first color filter in a thickness direction perpendicular to a front surface of the substrate, directly over a center of an emission area of the second color filter in the thickness direction perpendicular to the front surface of the substrate, and directly over a center of the light emission area in the thickness direction perpendicular to the front surface of the substrate, the low refractive index layer including at least one of a first blue pigment and a first blue dye;

a first color conversion layer overlapping the first color filter and including a semiconductor nanocrystal;

a second color conversion layer overlapping the second color filter and including a semiconductor nanocrystal; and a transmissive layer that overlaps the low refractive index layer, wherein a first thickness of the low refractive index layer overlapping the light emission area is different from a second thickness of the low refractive index layer overlapping the first color filter.

12. The display device of claim 11, wherein
the emission area of the first color filter is a red light emission area,
the emission area of the second color filter is a green light emission area, and
the light emission area is a blue light emission area, and
the color conversion panel includes a light blocking area.

13. The display device of claim 11, wherein
the first thickness is in a range of about 1 μm to about 6 μm, and
the second thickness is in a range of about 0.5 μm to about 3 μm.

14. The display device of claim 11, wherein
a content of the first blue pigment or first blue dye included in the low refractive index layer is in a range of about 1 wt % to about 2 wt %.

15. The display device of claim 11, wherein
the transmissive layer includes a second blue pigment or a second blue dye.

16. The display device of claim 15, wherein
a content of the second blue pigment or the second blue dye included in the transmissive layer is greater than a content of the first blue pigment or the first blue dye included in the low refractive index layer.

17. The display device of claim 15, wherein
the first blue pigment is different from the second blue pigment, and
the first blue dye is different from the second blue dye.

18. The display device of claim 11, wherein
a refractive index of the low refractive index layer is in a range of about 1.1 to about 1.3.

* * * * *